United States Patent
Kawasaki

(10) Patent No.: US 8,729,970 B2
(45) Date of Patent: May 20, 2014

(54) OSCILLATOR CIRCUIT

(75) Inventor: Takeshi Kawasaki, Kanagawa (JP)

(73) Assignee: Sumitomo Electric Industries, ltd., Osaka (JP)

( * ) Notice: Subject to any disclaimer, the term of this patent is extended or adjusted under 35 U.S.C. 154(b) by 7 days.

(21) Appl. No.: 13/492,066

(22) Filed: Jun. 8, 2012

(65) Prior Publication Data

US 2012/0313719 A1 Dec. 13, 2012

(30) Foreign Application Priority Data

Jun. 9, 2011 (JP) ................. 2011-128973

(51) Int. Cl.
*H03B 7/00* (2006.01)
(52) U.S. Cl.
USPC ............ 331/115; 331/107 R; 331/107 SL; 331/181
(58) Field of Classification Search
USPC ..... 331/96, 107 DP, 107 SL, 115, 117 D, 181
See application file for complete search history.

(56) References Cited

U.S. PATENT DOCUMENTS

| | | | | |
|---|---|---|---|---|
| 3,869,678 A | * | 3/1975 | Mahoney | 330/286 |
| 5,821,820 A | * | 10/1998 | Snider et al. | 331/48 |
| 6,011,446 A | * | 1/2000 | Woods | 331/185 |
| 6,169,461 B1 | * | 1/2001 | Andoh et al. | 331/117 D |
| 7,696,833 B2 | * | 4/2010 | Numata et al. | 331/107 SL |

FOREIGN PATENT DOCUMENTS

JP 2000-323931 A 11/2000

* cited by examiner

*Primary Examiner* — Joseph Chang
*Assistant Examiner* — Jeffrey Shin
(74) *Attorney, Agent, or Firm* — Westerman, Hattori, Daniels & Adrian, LLP

(57) ABSTRACT

An oscillator circuit includes a pair of negative-resistance circuits, a pair of transmission lines coupled to the pair of negative-resistance circuits respectively, a pair of pads that are provided symmetrically to each other with respect to the pair of transmission lines and are to be coupled to each other by a bonding wire, and a synthetic circuit to synthesize output signals of the pair of negative-resistance circuits.

11 Claims, 17 Drawing Sheets

FIG. 7A
FIG. 7B
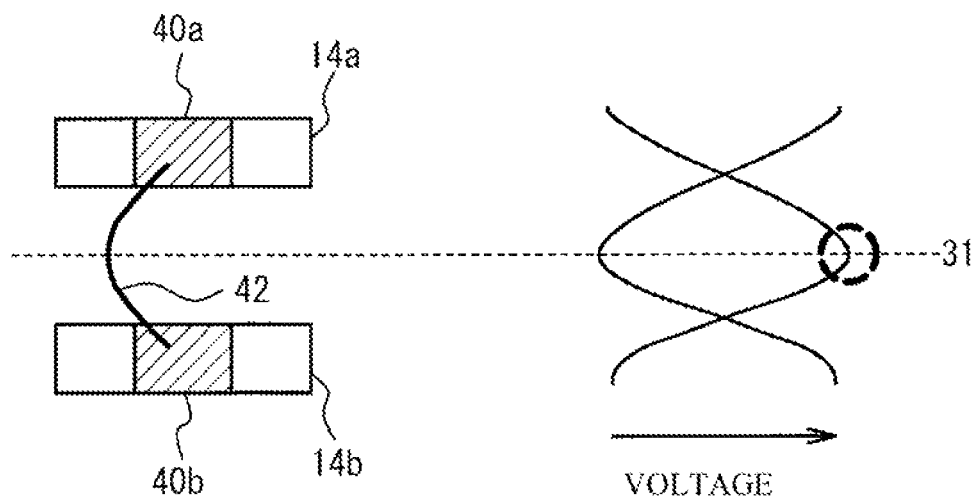
FIG. 7C
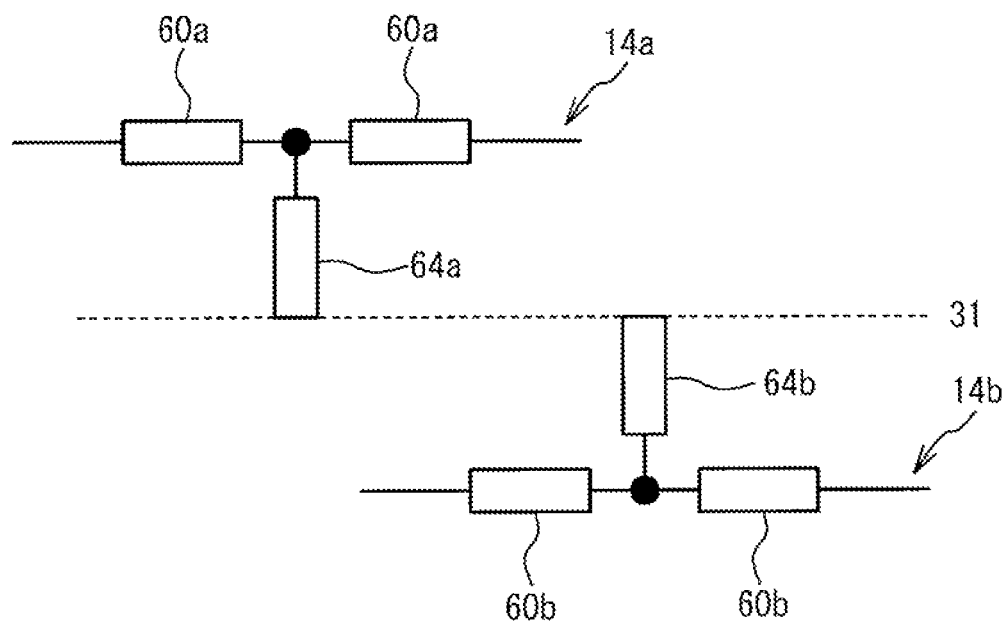

OSCILLATOR CIRCUIT

CROSS-REFERENCE TO RELATED APPLICATION

This application is based upon and claims the benefit of priority of the prior Japanese Patent Application No. 2011-128973, filed on Jun. 9, 2011, the entire contents of which are incorporated herein-by reference.

BACKGROUND (i) Technical Field

The present invention relates to a push-push oscillator circuit.

(ii) Related Art

Japanese Patent Application Publication No. 2000-323931 discloses a push-push oscillator circuit that has resonant circuits coupled to a pair of negative-resistance circuits respectively and synthesizes a fundamental wave or a harmonic wave of output signals of the negative-resistance circuits, as an oscillator circuit for high frequency.

SUMMARY

It is an object to provide an oscillator circuit that is capable of restraining characteristics degradation and adjusting an oscillation frequency with a simple method.

According to an aspect of the present invention, there is provided an oscillator circuit including a pair of negative-resistance circuits, a pair of transmission lines coupled to the pair of negative-resistance circuits respectively, a pair of pads that are provided symmetrically to each other with respect to the pair of transmission lines and are to be coupled to each other by a bonding wire, and a synthetic circuit to synthesize output signals of the pair of negative-resistance circuits.

According to another aspect of the present invention, there is provided an oscillator circuit including a pair of negative-resistance circuits, a pair of transmission lines that are respectively coupled to the pair of negative-resistance circuits, a conductor coupling symmetrical positions of the pair of transmission lines, and a synthetic circuit to synthesize output signals of the pair of negative-resistance circuits.

BRIEF DESCRIPTION OF THE DRAWINGS

FIG. 7A through FIG. 7C illustrate a function of a bonding wire in a case where signals transmitted in a pair of transmission lines have the same phase;

DETAILED DESCRIPTION

There is a case where a stub is coupled to a resonant circuit in a push-push oscillator circuit in order to adjust an oscillation frequency. A metal pattern acting as a stub is provided around a transmission line structuring the resonant circuit in advance. The metal pattern is coupled to the transmission line via a bonding wire. Thus, the oscillation frequency is adjusted. It is important that characteristics of each resonant circuit coupled to each negative-resistance circuit are similar to each other, in order to improve performance of the push-push oscillator circuit. However, when the oscillation frequency is high, a length difference of bonding wires for adjusting the oscillation frequency may cause have an influence on the characteristics of the stub. Therefore, there is a problem that adjusting of the oscillation frequency is difficult when establishing the push-push oscillator circuit for a high frequency. The high frequency may be defined as a frequency of 5 GHz or more at which a push-push oscillator circuit outputs.

[First Embodiment]

Figure 1:
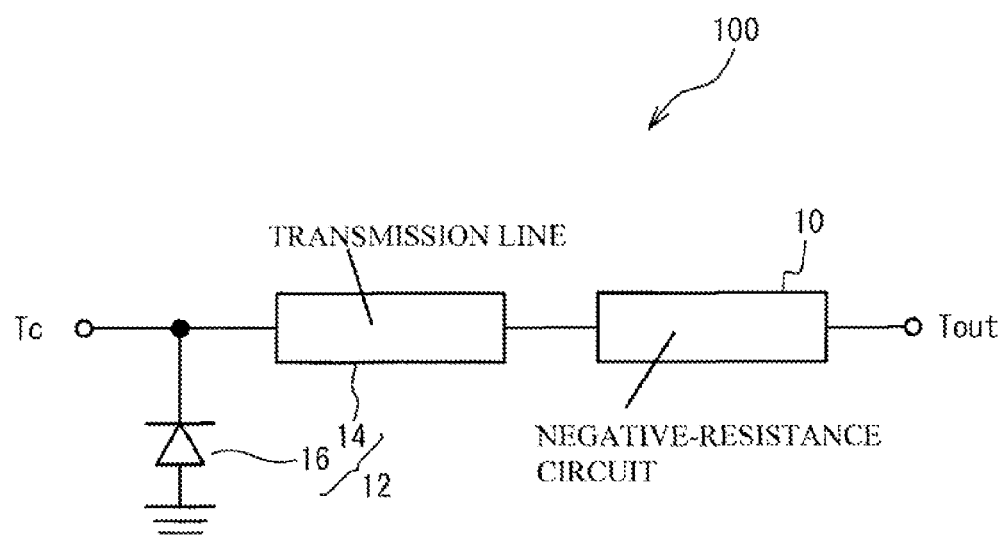
FIG. 1 illustrates a circuit diagram of an oscillator circuit in accordance with a first comparative example.

A description will be given of an oscillator circuit in accordance with a first comparative example. FIG. 1 illustrates a circuit diagram of an oscillator circuit 100 in accordance with the first comparative example. As illustrated in FIG. 1, the oscillator circuit 100 has a negative-resistance circuit 10 and a resonant circuit 12. The negative-resistance circuit 10 outputs an oscillation signal from an outputting terminal Tout. The resonant circuit 12 regulates an oscillation frequency of the oscillation signal. In the resonant circuit 12, a transmission line 14 and a varactor diode 16 are coupled in series. A control terminal Tc is coupled to a cathode of the varactor diode 16. A capacitance of the varactor diode 16 is adjustable with use of a voltage applied to the control terminal Tc. When the capacitance and the inductance of the resonant circuit 12 are expressed as "C" and "L", the oscillation frequency of the oscillation circuit "fosc" is expressed as follows.

$$fosc \propto 1/\sqrt{C \times L}$$

Figure 2A:
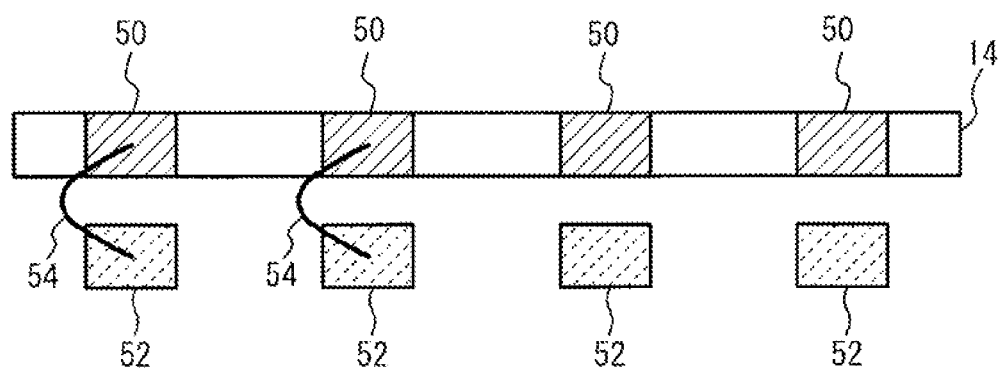
FIG. 2A illustrates a top view of a transmission line.
Figure 2B:
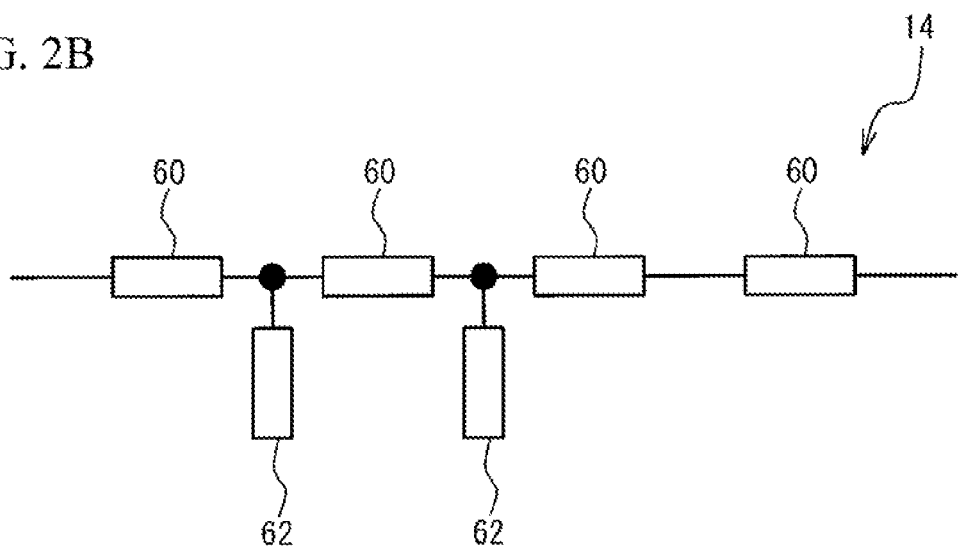
FIG. 2B illustrates an equivalent circuit diagram of the transmission line.

Next, a description will be given of a method of adjusting the oscillation frequency with use of a bonding wire. FIG. 2A illustrates a top view of the transmission line 14. FIG. 2B illustrates an equivalent circuit diagram of the transmission line 14. As illustrated in FIG. 2A, a pad 50 to which a bonding wire 54 is to be coupled is provided on the transmission line 14. A pad 52 is provided along the transmission line 14. The bonding wire 54 electrically couples the pad 50 and the pad 52. As illustrated in FIG. 2B, the transmission line 14 is illustrated with a plurality of distributed constant lines 60. A portion where the pads 50 and 52 are coupled by the bonding wire 54 acts as an open stub 62. Thus, the inductance of the transmission line 14 fluctuates. The number of couplings between the pad 50 and the pad 52 with use of the bonding wire 54 adjusts the oscillation frequency.

Figure 3A:
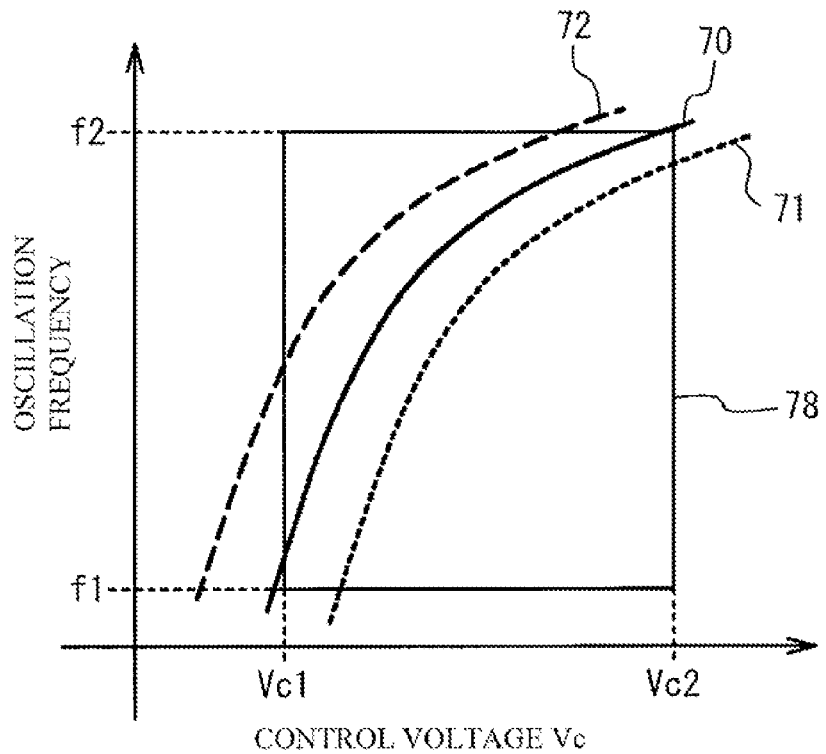
FIG. 3A and FIG. 3B illustrate a method of adjusting an oscillation frequency of an oscillator circuit.
Figure 3B:
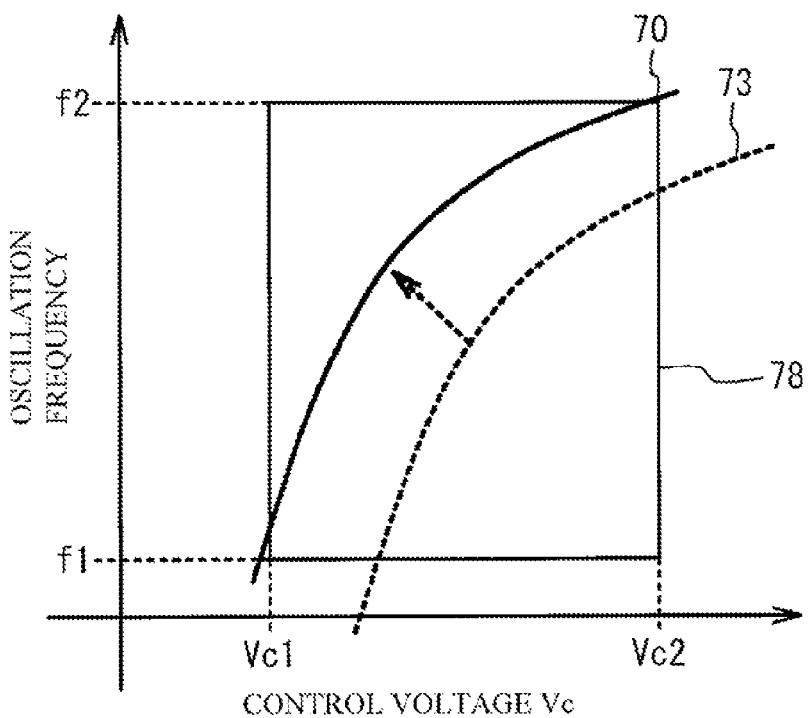

FIG. 3A and FIG. 3B illustrate a method of adjusting the oscillation frequency of the oscillator circuit. In FIG. 3A and FIG. 3B, a horizontal axis indicates a control voltage Vc applied to the control terminal Tc. A vertical axis indicates the oscillation frequency. As indicated by frequency characteristics 70 of FIG. 3A, in ideal characteristics, the oscillation frequency can be adjusted in a range from f1 to f2 by fluctuating the control voltage Vc in a range from Vc1 to Vc2. However, as indicated by frequency characteristics 71 and 72 of FIG. 3A, production tolerance may make a difference from the frequency characteristics 70. And so, as illustrated in FIG. 3B, the frequency characteristics are set on the side of low frequency in view of the production tolerance. The frequency characteristics are set so as to be overlapped with the ideal frequency characteristics 70 when the frequency characteristics are shifted toward high frequency at a maximum. When the frequency characteristics are shifted to the lower frequency characteristics 73 from the ideal frequency characteristics, the oscillation frequency is adjusted toward high frequency by forming a stub in the transmission line 14 with use of a bonding wire as illustrated in FIG. 2A and FIG. 2B. Thus, the ideal frequency characteristics are achieved.

Figure 4:
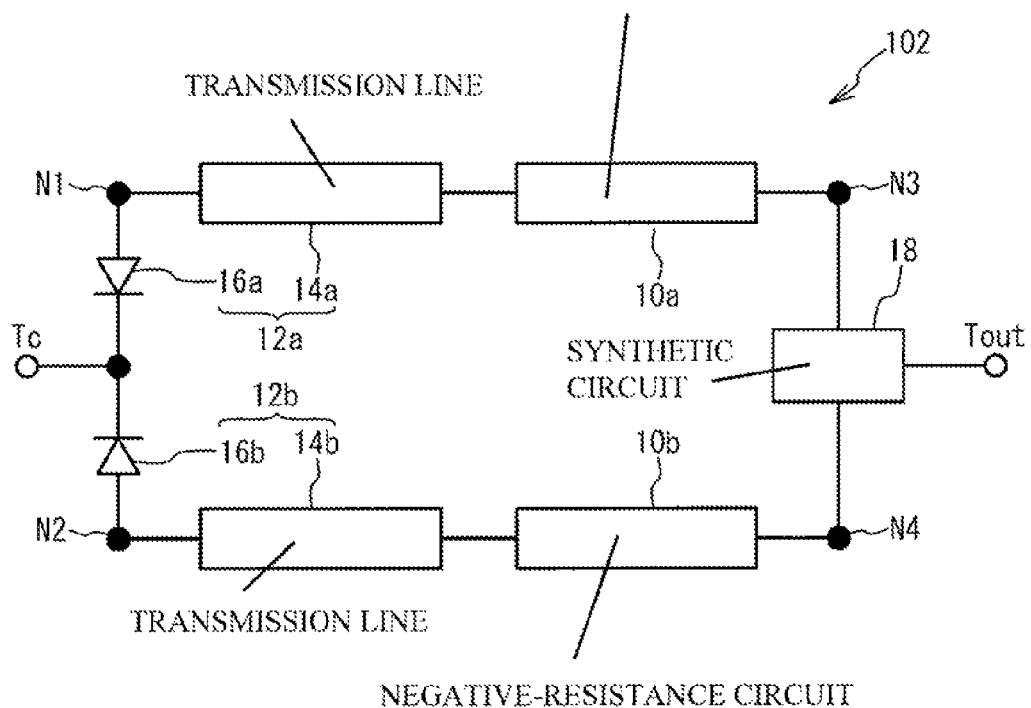
FIG. 4 illustrates a circuit diagram of an oscillator circuit in accordance with a first embodiment.

FIG. 4 illustrates a circuit diagram of an oscillator circuit 102 in accordance with a first embodiment. The oscillator circuit 102 has a pair of negative-resistance circuits 10a and 10b, a pair of resonant circuits 12a and 12b, and a synthetic circuit 18. The negative-resistance circuit 10a outputs an oscillation signal from an outputting node N3 to the synthetic circuit 18. The negative-resistance circuit 10b outputs an oscillation signal from an outputting node N4 to the synthetic circuit 18. The resonant circuit 12a is coupled to the negative-resistance circuit 10a. The resonant circuit 12b is coupled to the negative-resistance circuit 10b. The resonant circuit 12a has a transmission line 14a and a varactor diode 16a. The resonant circuit 12b has a transmission line 14b and a varactor diode 16b. The transmission lines 14a and 14b are symmetrical to each other. A cathode of the varactor diode 16a and a cathode of the varactor diode 16b are coupled to the control terminal Tc in common. A node between the transmission line 14a and the varactor diode 16a is a node N1. Another node between the transmission line 14b and the varactor diode 16b is a node N2. The synthetic circuit 18 synthesizes the outputs signals of the negative-resistance circuits 10a and 10b and outputs the synthesized signal to the outputting terminal Tout. With the structure, an output power of a fundamental wave can be enlarged when phases of fundamental waves of the output signals of the negative-resistance circuits 10a and 10b are equal to each other. When the phases of the fundamental waves of the output signals of the negative-resistance circuit 10a and 10b are opposite to each other, the output power of the fundamental waves can be reduced and an output power of second order harmonic waves can be enlarged.

Figure 5:
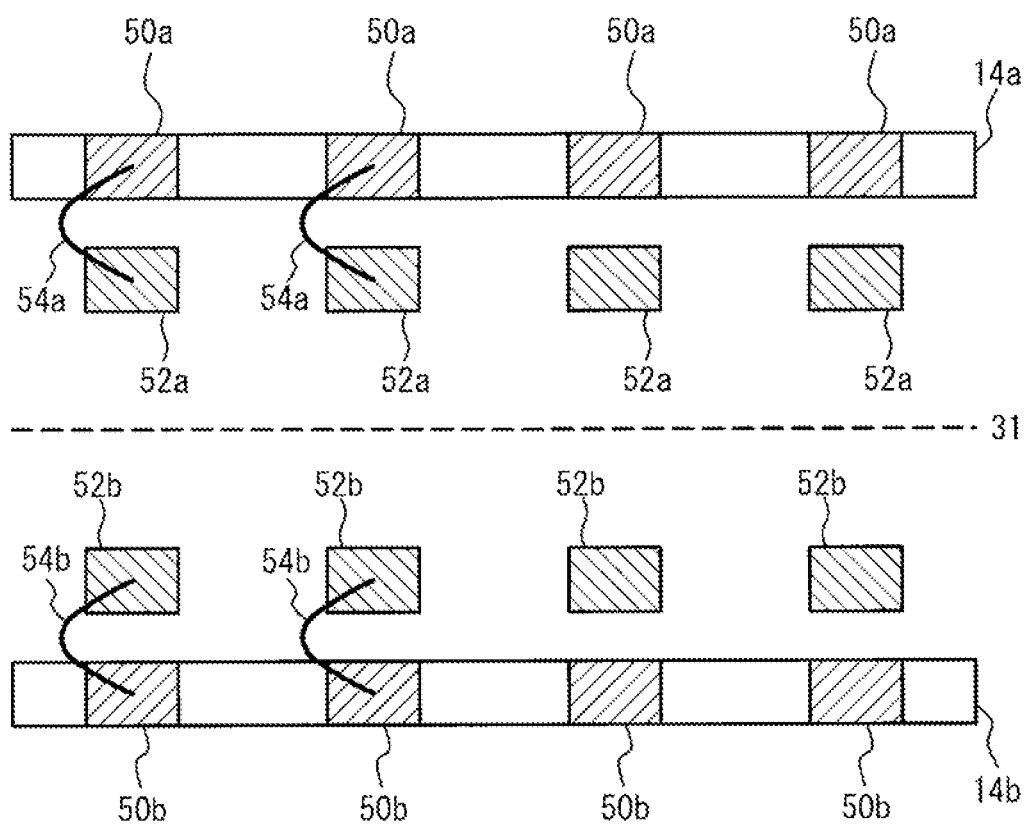
FIG. 5 illustrates a top view of transmission lines of an oscillator circuit in accordance with a second comparative example.

FIG. 5 illustrates a top view of transmission lines of an oscillator circuit in accordance with a second comparative example. A circuit diagram of the oscillation circuit in accordance with the second comparative example is the same as that of FIG. 4. As illustrated in FIG. 5, pads 50a are provided on the transmission line 14a, and pads 50b are provided on the transmission line 14b. Pads 52a are provided along the transmission line 14a, and pads 52b are provided along the transmission line 14b. The transmission line 14a and the pads 50a and 52a are symmetrical to the transmission line 14b and the pads 50b and 52b, with respect to a line 31. Similarly to FIG. 2A, a bonding wire 54a is provided between the pad 50a and pad 52a, and a bonding wire 54b is provided between the pad 50b and 52b. Thus, an oscillation frequency can be adjusted. However, when a length of the bonding wire 54a is different from that of the bonding wire 54b, a length of the open stub 62 illustrated in FIG. 2B is different from each other. This makes a difference between frequency of an output signal from the negative-resistance circuit 10a and that of the negative-resistance circuit 10b. This results in degradation of the characteristics of the oscillator circuit. In the second comparative example, the number of bonding wires is twice as many as that of the first comparative example of FIG. 2A.

Figure 6:
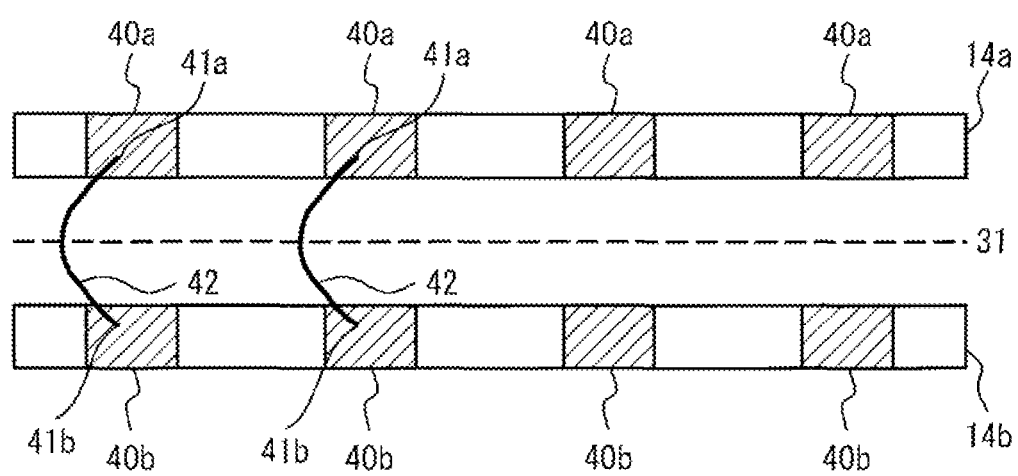
FIG. 6 illustrates a top view of a transmission line of an oscillator circuit in accordance with a first embodiment.

FIG. 6 illustrates a top view of the transmission line of the oscillator circuit in accordance with the first embodiment. As illustrated in FIG. 6, pads 40a are provided on the transmission line 14a, and pads 40b are provided on the transmission line 14b. The pad 40a on the transmission line 14a is arranged symmetrically to the pad 40b on the transmission line 14b. That is, the pad 40a is symmetrical to the pad 40b with respect to the intermediate line 31 between the transmission lines 14a and 14b. The pad 40a is electrically coupled to the pad 40b via a bonding wire 42. A position 41a of the pad 40a to which the bonding wire 42 is connected is symmetrical to a position 41b of the pad 40b to which the bonding wire 42 is connected with respect to the intermediate line 31.

FIG. 7A through FIG. 7C illustrate a function of a bonding wire in a case where signals transmitted in a pair of transmission lines have the same phase. As illustrated in FIG. 7A, the bonding wire 42 is electrically coupled between the pad 40a of the transmission line 14a and the pad 40b of the transmission line 14b. For example, as illustrated in FIG. 7B, an anti-node of a voltage of a standing wave in the bonding wire 42 appears on the line 31. The position of the anti-node does not always appear at a physical midpoint of the bonding wire 42. The anti-node may appear at a midpoint of an electrical length. FIG. 7C illustrates an equivalent circuit of FIG. 7A. As illustrated in FIG. 7C, in an equivalent circuit of the transmission line 14a, an open stub 64a is coupled to a node between distributed constant lines 60a structuring the transmission line 14a. In an equivalent circuit of the transmission line 14b, an open stub 64b is coupled to a node between distributed constant lines 60b structuring the transmission line 14b. A length of the open stub 64a is approximately equal to that of the open stub 64b, because the position of the anti-node of FIG. 7B is a midpoint between the transmission lines 14a and 14b. Therefore, even if there is variability of the bonding wire 42, the symmetry of the transmission lines 14a and 14b is not degraded.

Figure 8A:
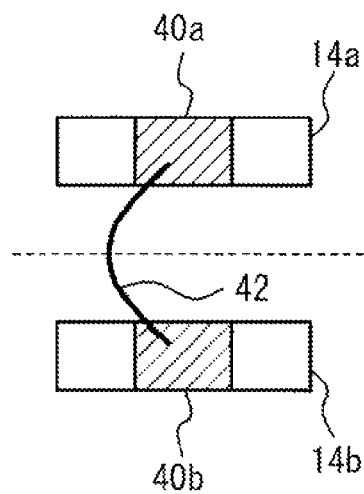
FIG. 8A through FIG. 8C illustrate a function of a bonding wire in a case where phases of signals propagating in a pair of transmission lines are opposite to each other.
Figure 8B:
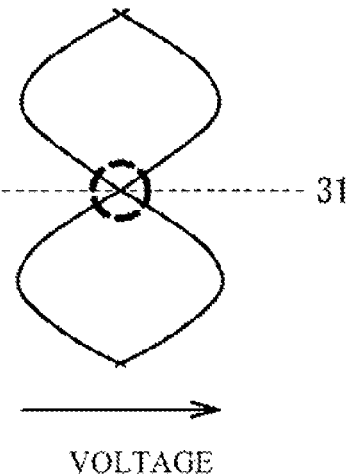
Figure 8C:
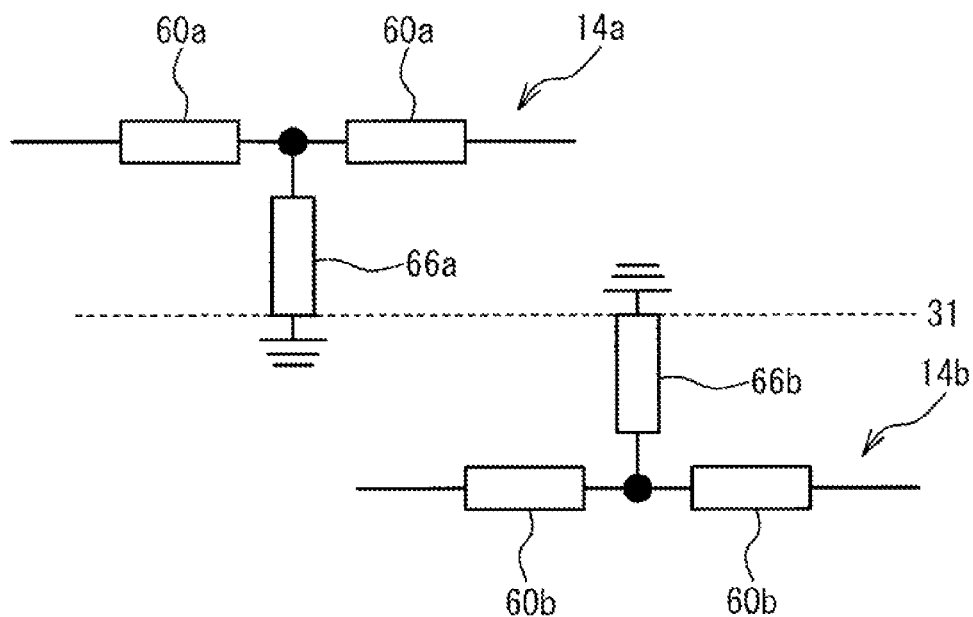

FIG. 8A through FIG. 8C illustrate a function of a bonding wire in a case where phases of signals propagating in a pair of transmission lines are opposite to each other. FIG. 8A is the same as FIG. 7A. Therefore, the explanation of FIG. 8A is omitted. For example, as illustrated in FIG. 8B, a node of the voltage of the standing wave in the bonding wire 42 appears on the line 31. The position of the node does not always appear at a physical midpoint of the bonding wire 42. The node may appear at a midpoint of an electrical length. FIG. 8C illustrates an equivalent circuit of FIG. 8A. As illustrated in FIG. 8C, in an equivalent circuit of the transmission line 14a, a short stub 66a is coupled to a node between the distributed constant lines 60a structuring the transmission line 14a. In an equivalent circuit of the transmission line 14b, a short stub 66b is coupled to a node between the distributed constant lines 60b structuring the transmission line 14b. A length of the short stub 66a is approximately equal to that of the short stub 66b, because the position of the node of FIG. 8B is a midpoint between the transmission lines 14a and 14b. Therefore, even if there is variability of the bonding wire 42, the symmetry of the transmission lines 14a and 14b is not degraded.

Figure 9:
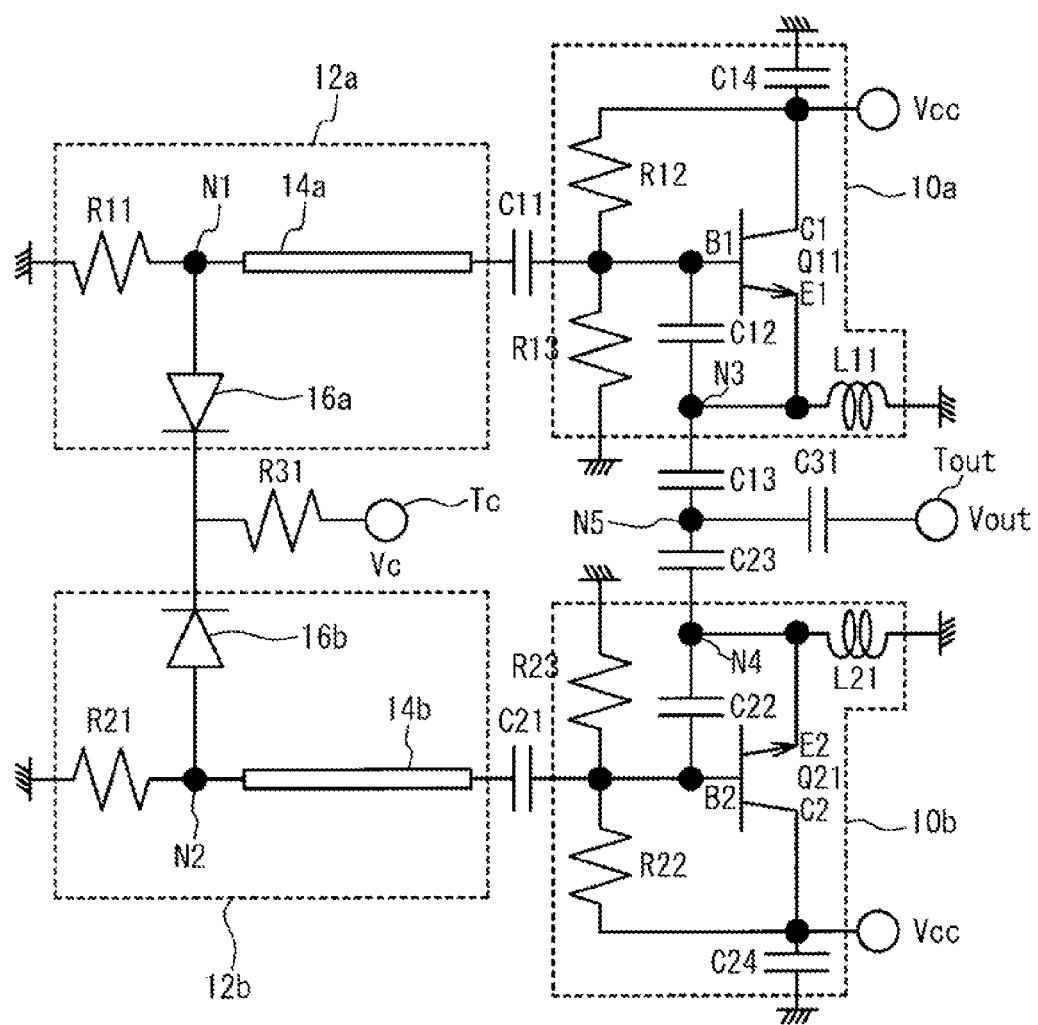
FIG. 9 illustrates a circuit diagram of an oscillator circuit used for a simulation.

The characteristics of the oscillator circuit in accordance with the first embodiment was simulated. FIG. 9 illustrates a circuit diagram of an oscillator circuit used for the simulation. As illustrated in FIG. 9, the negative-resistance circuit 10a has a bipolar transistor Q11. An emitter E1 of the bipolar transistor Q11 is grounded via an inductor L11. The emitter E1 is coupled to a base B1 via a feedback capacitor C12. A collector C1 is coupled to a power supply Vcc. The power supply Vcc is grounded via a direct-current cutting capacitor C14. The resistor R12 is coupled between the power supply Vcc and the base B1. The resistor R13 is coupled between the base Bl and the ground. The resistors R12 and R13 set an electrical potential of the base B1. An output signal of the negative-resistance circuit 10a is output from an outputting node N3 coupled to the emitter E1. The negative-resistance circuit 10b has a bipolar transistor Q21, an inductor L21, capacitors C22 and C24 and resistors R22 and R23, and is coupled to them as well as the negative-resistance circuit 10a.

The resonant circuit 12a has a micro strip line as the transmission line 14a and the varactor diode 16a. A node Ni between the transmission line 14a and the varactor diode 16a is grounded via the resistor R11. A cathode of the varactor diode 16a is coupled to the control terminal To via a resistor R31. The resonant circuit 12b has the transmission line 14b, the varactor diode 16b and the resistor R21. A node N2 between the transmission line 14b and the varactor diode 16b is grounded via the resistor R21.

A coupling capacitor C11 is coupled between the resonant circuit 12a and the base B1 of the transistor Q11 of the negative-resistance circuit 10a. A coupling capacitor C12 is coupled between the resonant circuit 12b and the base B2 of the transistor Q21 of the negative-resistance circuit 10b. The capacitors C13 and C23 are coupled between an outputting node N3 of the negative-resistance circuit 10a and an outputting node N4 of the negative-resistance circuit 10b in series. A capacitor C31 is coupled between a node N5 between the capacitors C13 and C23 and the outputting terminal Tout. The node N5 acts as a synthetic circuit. In the following simulation, the bipolar transistors Q11 and Q21 are a GaAs-based HBT (Hetero Bipolar Transistor). The transmission lines 14a and 14b are a micro strip line in which a ground metal is provided on a lower face of a GaAs substrate, and a wiring pattern is provided on an upper face of the GaAs substrate. The synthetic circuit 18 synthesizes oscillation signals of which fundamental waves have an opposite phase to each other.

Figure 10A:
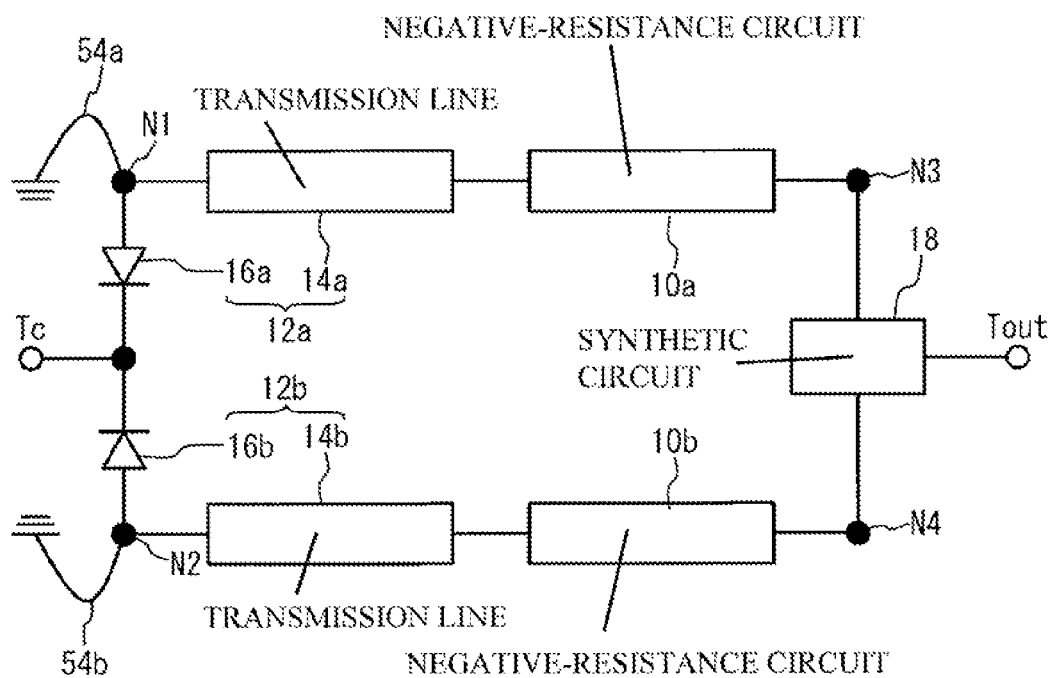
FIG. 10A and FIG. 10B illustrate a circuit diagram of an oscillator circuit subjected to the simulation.
Figure 10B:
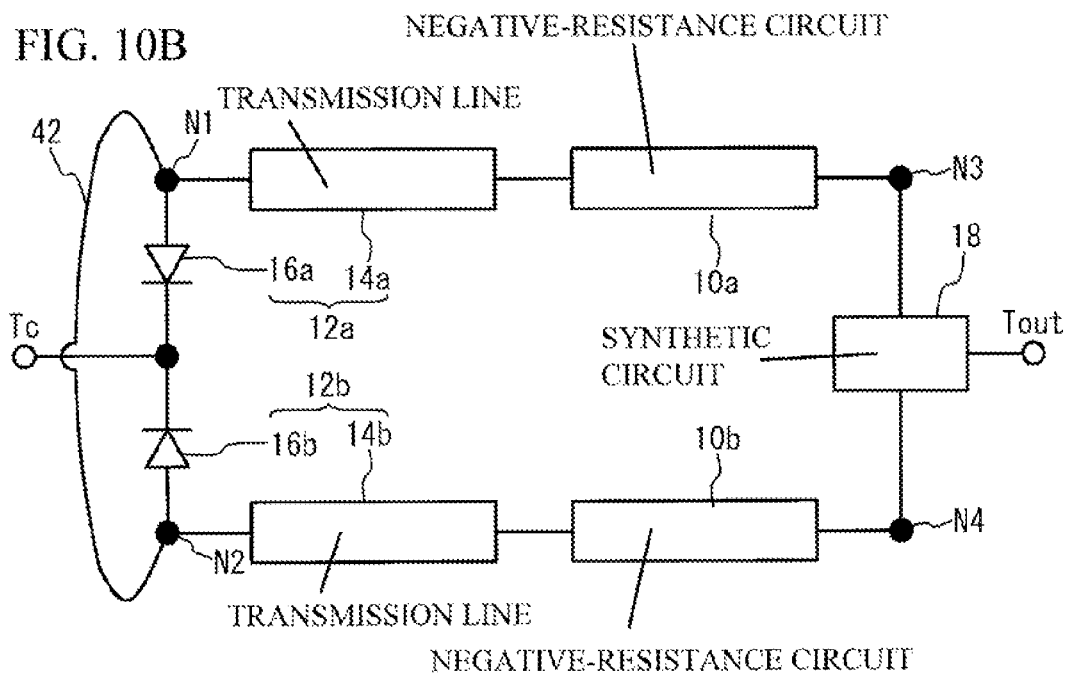

FIG. 10A and FIG. 10B illustrate a circuit diagram of the oscillator circuit subjected to the simulation. The simulation was performed with respect to the following four oscillator circuits. A circuit diagram of a third comparative example is the same as that of FIG. 4. In the third comparative example, a bonding wire does not couple the node N1 and the node N2. A circuit diagram of a fourth comparative example is the same as that of FIG. 10A. In the fourth comparative example, the Au bonding wire 54a having a diameter of 25 µm and a length of 1 mm is coupled between the node N1 and the ground, and the Au bonding wire 54b having the same diameter and length as the Au bonding wire 54a is coupled between the node N2 and the ground. A circuit diagram of a fifth comparative example is the same as that of FIG. 10A. In the fifth comparative example, the length of the bonding wire 54b is 0.8 mm. The other structure is the same as that of the fourth comparative example. In the first embodiment, the Au bonding wire 42 having a diameter of 25 µm and a length of 2 mm is coupled between the node N1 and the node N2, as illustrated in FIG. 10B. The node N1 and the node N2 correspond to edges of the transmission lines 14a and 14b. That is, in the first embodiment, the bonding wire 42 is coupled to the edges of the transmission lines 14a and 14b.

Figure 11A:
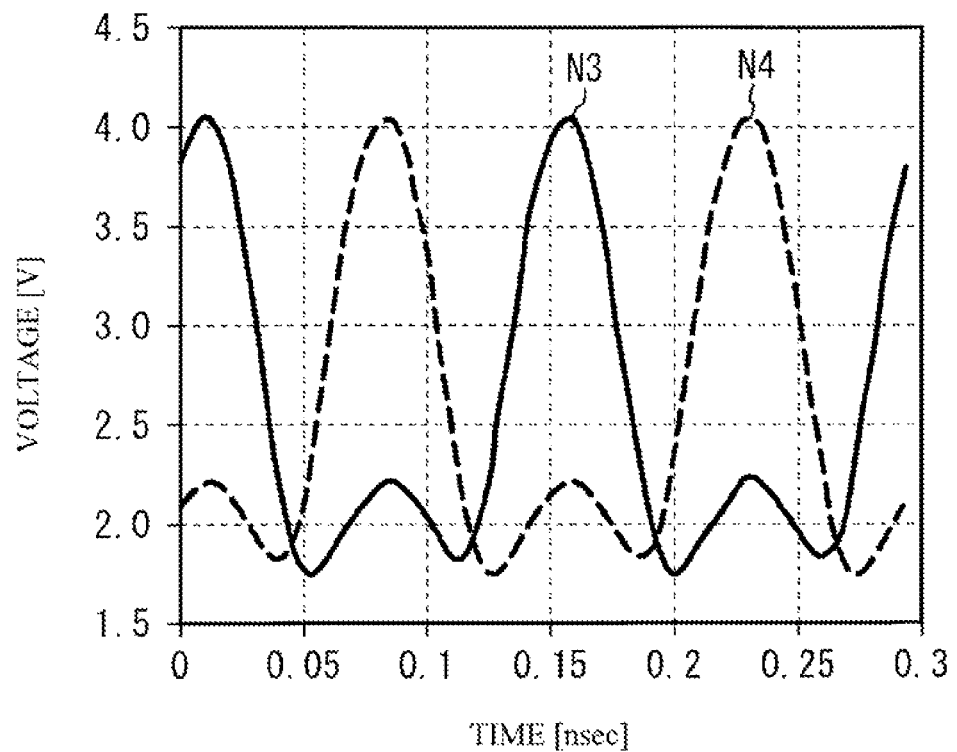
FIG. 11A and FIG. 11B illustrate voltages at a node N3 and a node N4 with respect to time of a third comparative example and a fourth comparative example.
Figure 11B:
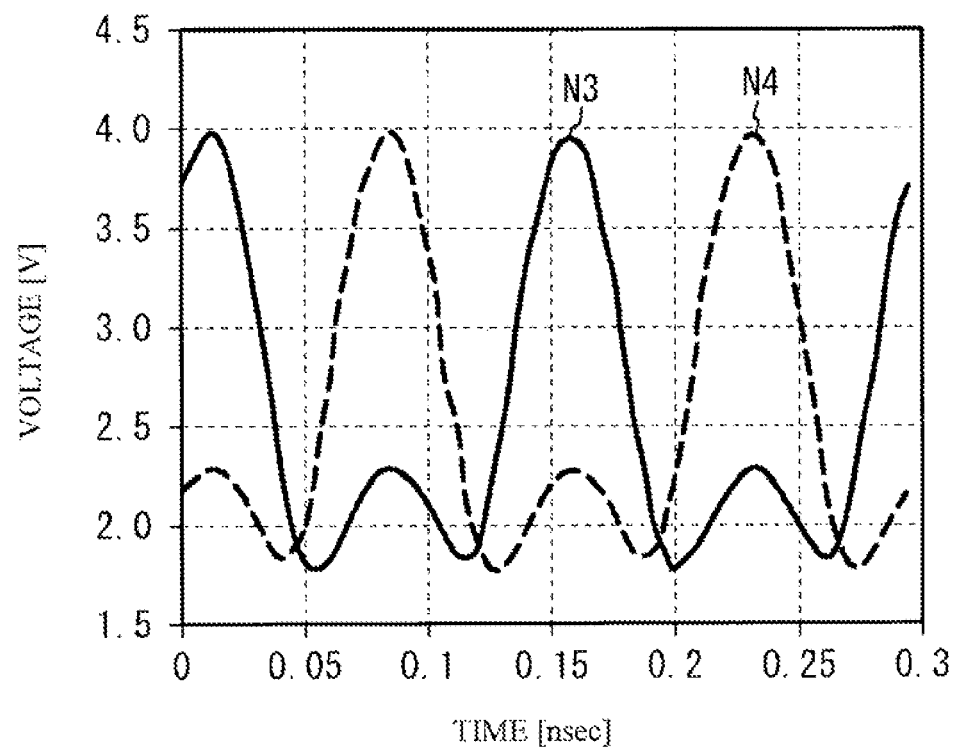
Figure 12A:
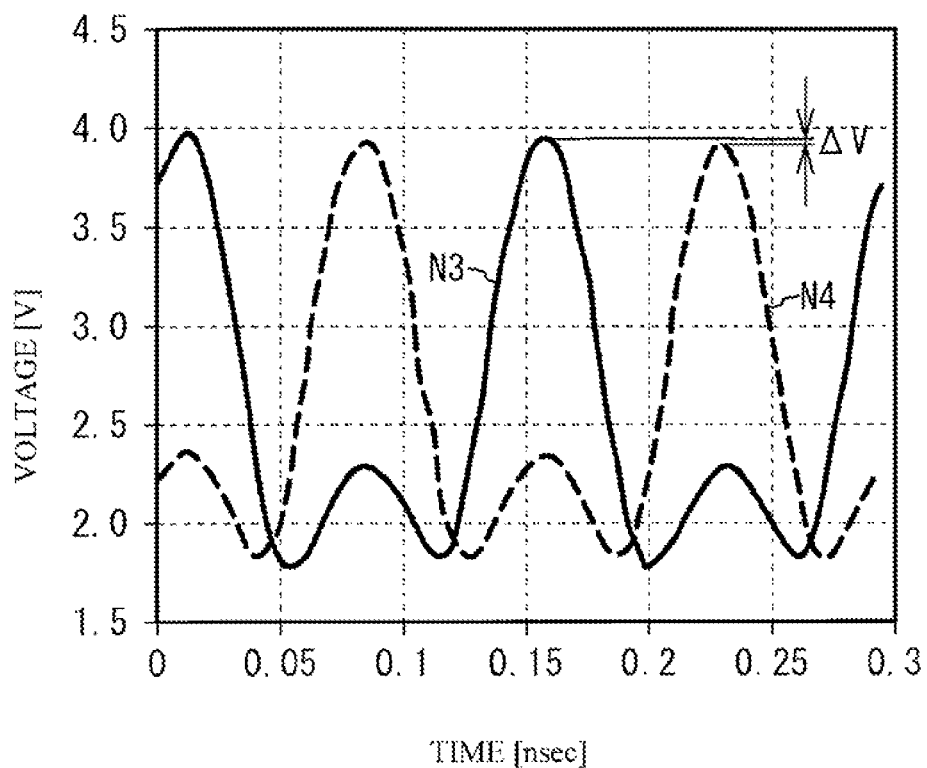
FIG. 12A and FIG. 12B illustrate voltages at a node N3 and a node N4 with respect to time of a fifth comparative example and the first embodiment.
Figure 12B:
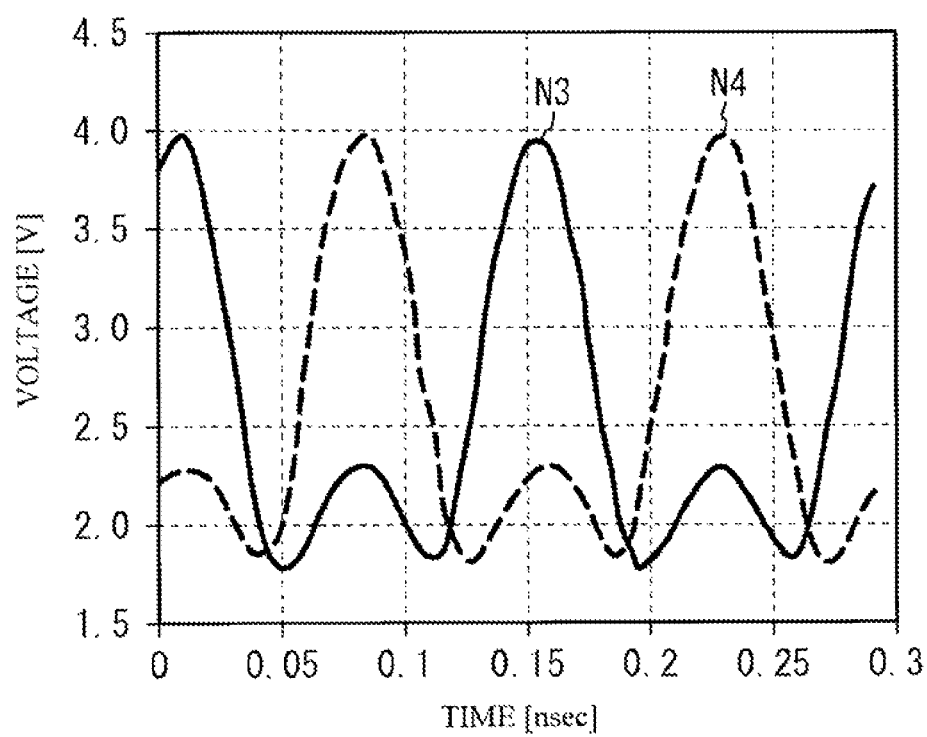
Figure 13:
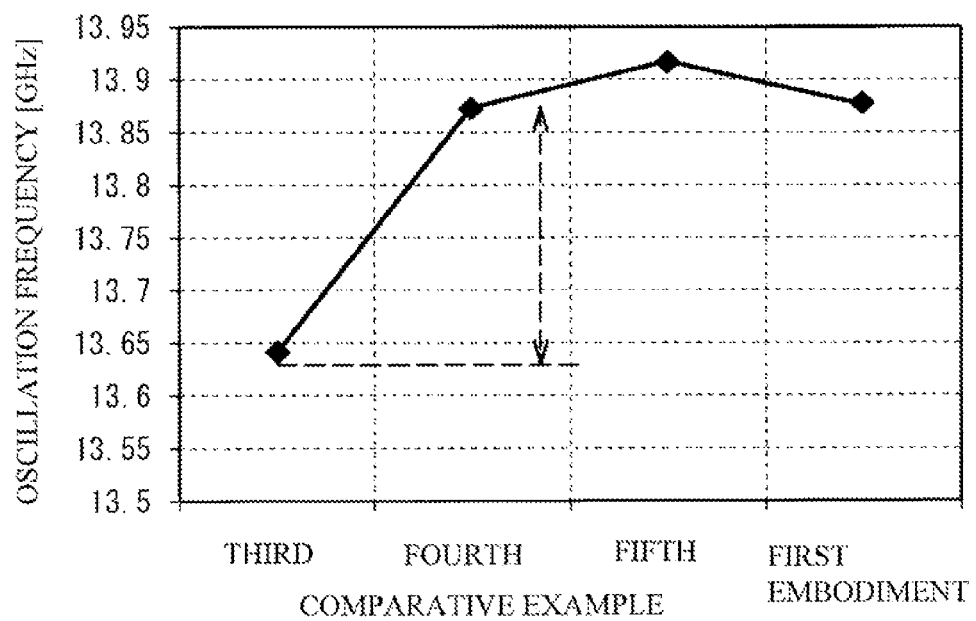
FIG. 13 illustrates an oscillation frequency of the third through fifth comparative examples and the first embodiment.
Figure 14:
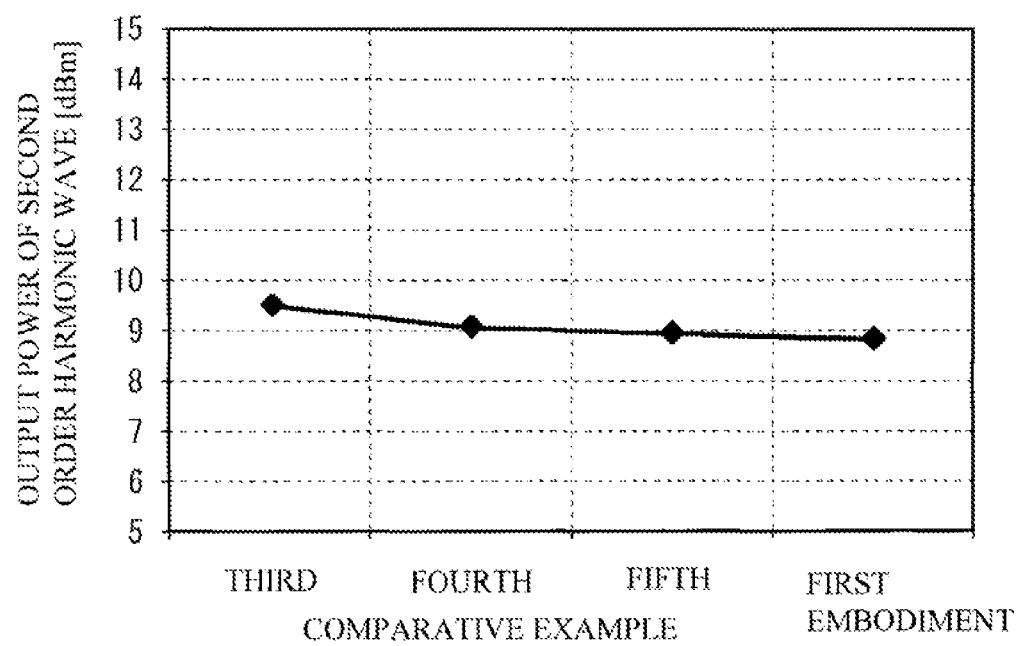
FIG. 14 illustrates output powers of second order harmonic waves of the third through fifth comparative examples and the first embodiment.
Figure 15:
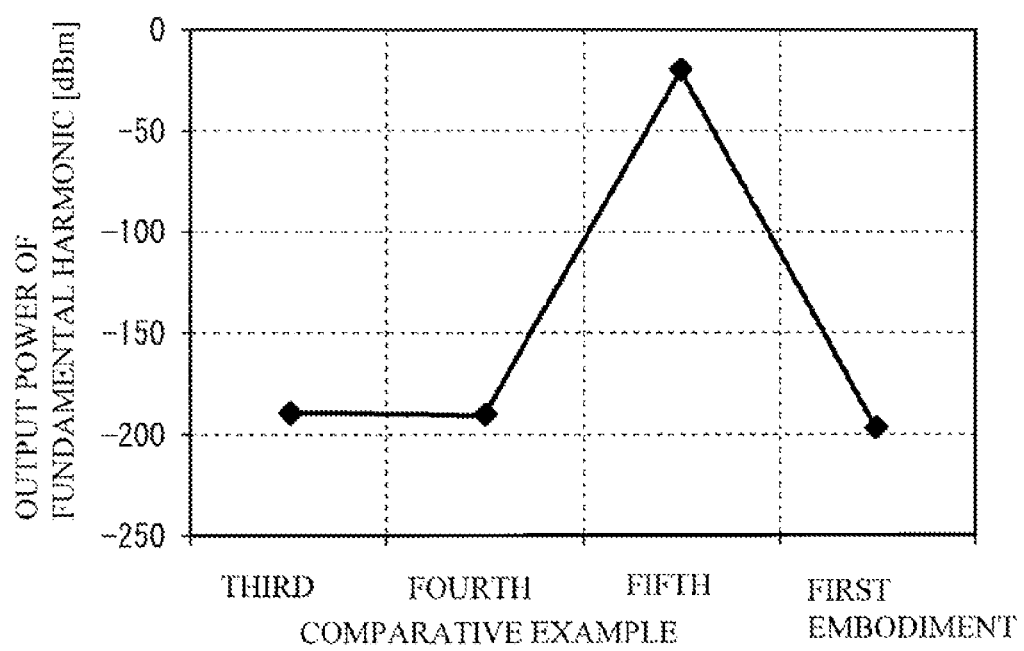
FIG. 15 illustrates output powers of fundamental waves of the third through fifth examples and the first embodiment.

FIG. 11A through FIG. 12B illustrate voltages at the node N3 and the node N4 with respect to time of the third through fifth comparative examples and the first embodiment. FIG. 13 illustrates an oscillation frequency (second order harmonic wave) of the third through fifth comparative examples and the first embodiment. FIG. 14 illustrates output powers of the second order harmonic waves of the third through fifth comparative examples and the first embodiment. FIG. 15 illustrates output powers of fundamental waves of the third through fifth examples and the first embodiment. As illustrated in FIG. 11A and FIG. 11B, in the third and fourth comparative examples, the phase of the voltage of the node N3 is opposite to that of the node N4, and the amplitude of the voltage of the node N3 is the same as that of the node N4. As illustrated in FIG. 13, in the fourth comparative example in which a short stub is structured with the bonding wires 54a and 54b, an oscillation frequency is adjusted on the side of high frequency compared to the third comparative example. An arrow of a dotted line indicates the frequency difference. As illustrated in FIG. 12A, in the fifth comparative example, the length of the bonding wire 54a is different from that of the bonding wire 54b. Therefore, a voltage difference ΔV is made between the node N3 and the node N4. Thus, as illustrated in FIG. 15, in the fifth comparative example, the output power of the fundamental wave gets larger. As illustrated in FIG. 12B, in the first embodiment, electrical lengths of short stubs caused by the bonding wire 42 are deemed to be the same. Therefore, the amplitudes of the voltages of the node N3 and the node N4 are equal to each other.

As illustrated in FIG. 13, in the first embodiment, the oscillation frequency can be adjusted on the side of high frequency with use of the bonding wire 42, compared to the third comparative example. As illustrated in FIG. 14, the output power of the second order harmonic wave is approximately equal to that of the third comparative example. As illustrated in FIG. 15, the output power of the fundamental wave of the first embodiment is approximately equal to that of the third comparative example.

As described with reference to FIG. 3A and FIG. 3B, as illustrated in FIG. 3B, the frequency characteristics are set on the side of low frequency in view of production tolerance. When the production tolerance shifts the frequency characteristics toward high frequency, one or more bonding wires 42 is coupled between the transmission lines 14a and 14b so that the frequency characteristics get closer to the ideal frequency characteristics 70. Thus, the frequency characteristics get closer to the ideal frequency characteristics 70. When the ideal frequency characteristics 70 are established without the bonding wire 42, it is not necessary to couple the bonding wire 42.

In the first embodiment, as illustrated in FIG. 4, the pair of resonant circuits 12a and 12b are respectively coupled to the pair of negative-resistance circuits 10a and 10b and include the transmission lines 14a and 14b arranged symmetrically to each other. The pair of pads 40a and 40b are respectively provided on the pair of transmission lines 14a and 14b and arranged symmetrically to each other. The bonding wire 42 is capable of coupling the pair of pads 40a and 40b. The synthetic circuit 18 synthesizes output signals of the pair of negative-resistance circuits 10a and 10b. In the oscillator circuit, as illustrated in FIG. 6, the pair of transmission lines 14a and 14b are electrically coupled to each other, when the bonding wire 42 couples the pairs of pads 40a and 40b. The pair of pads 40a and 40b are respectively provided so that the bonding wire 42 is capable of electrically coupling the positions 41a and 41B positioned symmetrically to each other on the pair of transmission lines 14a and 14b. For example, in the transmission lines 14a and 14b, an electrical length from the negative-resistance circuit 10a to the position 41a to be coupled to the bonding wire 42 is approximately equal to that from the negative-resistance circuit 10b to the position 41b to be coupled to the bonding wire 42. Therefore, with a simple method of coupling the bonding wire 42 between the pads 40a and 40b as illustrated in FIG. 6, the oscillation frequency can be adjusted as illustrated in FIG. 3A and FIG. 3B. That is, it is possible to absorb variability of the bonding wire and adjust the oscillation frequency. Therefore, in particular, the embodiment is useful in an oscillator circuit operating at a high frequency of 5 GHz or more. As illustrated in FIG. 7C and FIG. 8C, the lengths of the open stubs 64a and 64b or the lengths of the short stubs 66a and 66b that are equivalently formed by the bonding wire 42 may be equal to each other. Thus, as illustrated in FIG. 12B and FIG. 14, amplitude of the output signals of the pair of the negative-resistance circuit 10a and 10b may be approximately equal to each other. And, the degradation of the characteristics of the fifth comparative example is restrained. Further, the number of the bonding wires may be reduced to half compared to the second comparative example illustrated in FIG. 5.

When the oscillation frequency is close to the ideal one without the bonding wire 42, it is not necessary to provided the bonding wire 42. When the oscillation frequency is adjusted with use of the bonding wire 42, the pair of pads 50a and 50b are coupled to each other via the bonding wire 42.

The synthetic circuit 18 synthesizes the output signals having an opposite phase to each other of the pair of negative-resistance circuits 10a and 10b. For example, the synthetic circuit 18 synthesizes the output signals on condition that the phases of the fundamental waves are opposite to each other and the phases of the second order harmonic waves are equal to each other. Thus, the output power of the fundamental wave is restrained as illustrated in FIG. 14.

As illustrated in FIG. 6, the pair of pads 40a and 40b are respectively provided on the transmission lines 14a and 14b. Thus, the oscillation circuit is downsized.

It is preferable that the electrical length of the bonding wire 42 is ½λ or less. "λ" is a wavelength of the fundamental waves of the output signals of the negative-resistance circuits 10a and 10b. This is because, when the electrical length is more than ½λ, a node or an anti-node of a standing wave appears in the bonding wire 42.

The symmetrical positions of the pair of transmission lines 14a and 14b may be positions where phases of standing waves are approximately equal to each other in a case where the negative-resistance circuits 10a and 10b output oscillation signals having the same phase, or may be positions where the phases of the standing waves are different from each other by approximately 180 degrees in a case where the negative-resistance circuits 10a and 10b output oscillation signals having an opposite phase. It is preferable that an allowable error of the positions of the transmission lines 14a and 14b to which paths are electrically coupled via the bonding wire 42 (in the first embodiment, the positions 41a and 41b of the pads 40a and 40b to which the bonding wire 42 is coupled) are in a range of plus minus ⅒λ. For example, it is preferable that a distance from the negative-resistance circuit 10a to the position 41a is equal to that from the negative-resistance circuit 10b to the position 41b so that a difference between a distance from the negative-resistance circuit 10a to the position 41a and that from the negative-resistance circuit 10b to the position 41b is in a range of plus minus ⅒ λ.

[Second Embodiment]

Figure 16:
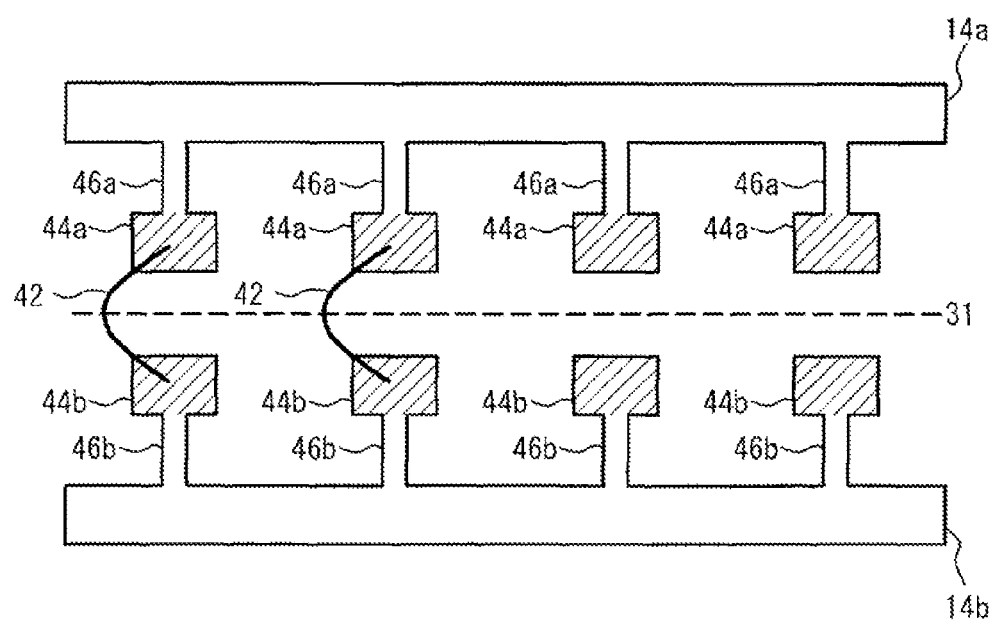
FIG. 16 illustrates a top view of a transmission line of an oscillator circuit in accordance with a second embodiment.

FIG. 16 illustrates a top view of a transmission line of an oscillator circuit in accordance with a second embodiment. As illustrated in FIG. 16, pads 44a and 44b are respectively provided separately from the transmission lines 14a and 14b. The pads 44a and 44b are electrically coupled to the transmission lines 14a and 14b by feeds 46a and 46b respectively. The bonding wire 42 couples the pad 44a and the pad 44b. The transmission line 14a, the pad 44a and the feed 46a are provided symmetrically to the transmission line 14b, the pad 44b and the feed 46b with respect to the line 31. The transmission lines 14a and 14b, the pads 44a and 44b and the feeds 46a and 46b are made of an identical metal on a substrate.

In the second embodiment, the pair of the pads 44a and 44b are coupled to each other via the bonding wire 42. And, the pair of transmission lines 14a and 14b are electrically coupled to each other. The pair of pads 44a and 44b are provided separately from the transmission lines 14a and 14b respectively. Thus, a damage of the transmission lines 14a and 14b caused by wire bonding is restrained as well as the first embodiment, because the bonding wire 42 is not jointed to the transmission lines 14a and 14b.

The feeds 46a and 46b having a width smaller than the pad are respectively provided between the pair of pads 44a and 44b and the pair of transmission lines 14a and 14b. Thus, even if the bonding wire 42 is not provided, influence of the pads 44a and 44b on the high frequency signal propagating in the transmission lines 14a and 14b is reduced.

Figure 17:
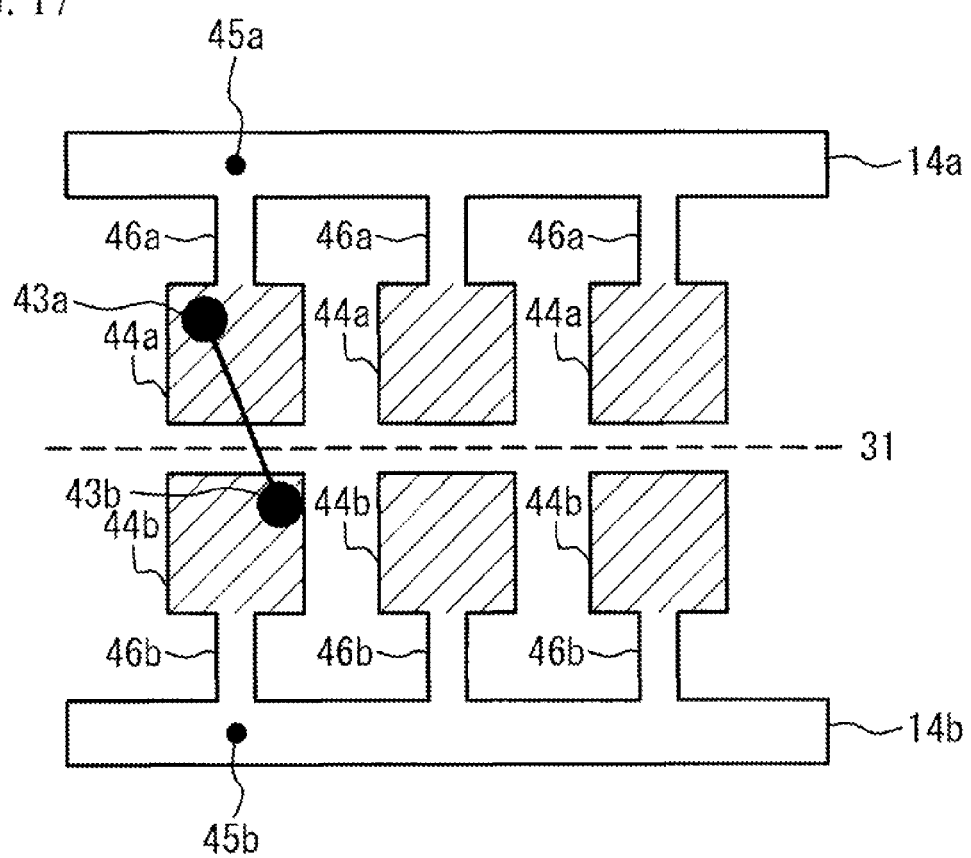
FIG. 17 illustrates a coupling example of a bonding wire in the second embodiment.

FIG. 17 illustrates a coupling example of a bonding wire in the second embodiment. As illustrated in FIG. 17, positions 45a and 45b are symmetrical positions of the transmission lines 14a and 14b that are electrically coupled by the pair of pads 44a and 44b via the bonding wire 42. A connection position 43a of the bonding wire 42 in the pad 44a is on the side of the transmission line 14a in the pad 44a. A connection position 43b of the bonding wire 42 in the pad 44b is on the opposite side of the transmission line 14b in the pad 44b. In this way, it is assumed that the connection positions 43a and 43b coupled by the pads 44a and 44b via the bonding wire 42 are not symmetrical to each other with respect to the line 31. In this case, positions between the position 45a of the transmission line 14a and the position 45b of the transmission line 14b of which impedance is approximately the same (for example, an electronic midpoint) are a node or anti-node of a standing wave. Therefore, lengths and connection positions of an open stub or a short stub coupled to the transmission lines 14a and 14B equivalently are approximately symmetrical to each other. Therefore, even if the connection positions of the bonding wire 42 are not symmetrical, influence on oscillation characteristics is small. In accordance with the second embodiment, even if the connection position of the bonding wire 42 is shifted, the influence on the oscillation characteristics is small.

In the first embodiment and the second embodiment, the resonant circuits 12a and 12b have the pair of varactor diodes 16a and 16b that are respectively coupled to the pair of transmission lines 14a and 14b. That is, a VCO (Voltage Controlled Oscillator) is described as an oscillator circuit. The oscillator may be an oscillator circuit other than the VCO. In the simulation of the first embodiment, the GaAs-based HBT was used as a transistor of the negative-resistance circuits 10a and 10b. The transistor of the negative-resistance circuits 10a and 10b may be an InP-based HBT, a GaAs-based FET (Field Effect Transistor) or a GaN-based FET. In view of reducing phase noise, it is preferable that a bipolar transistor is used. The transmission lines 14a and 14b are provided on the same chip as the transistor. The GaAs substrate is used as the substrate on which the transmission lines 14a and 14b are provided. The substrate on which the transmission lines 14a and 14b are provided may be an InP substrate, a SiC substrate or the like. The transmission lines 14a and 14b may be provided on a substrate such as a resin or ceramics. The transmission lines 14a and 14b are a micro strip line. However, the transmission lines 14a and 14b may be a transmission line such as a coplanar line.

The present invention is not limited to the specifically disclosed embodiments and variations but may include other embodiments and variations without departing from the scope of the present invention.

What is claimed is:

1. An oscillator circuit comprising:
   a pair of negative-resistance circuits;
   a pair of transmission lines coupled to the pair of negative-resistance circuits respectively;
   a pair of pads that are provided symmetrically to each other with respect to the pair of transmission lines and are to be coupled to each other by a bonding wire; and
   a synthetic circuit to synthesize output signals of the pair of negative-resistance circuits,
   wherein the synthetic circuit synthesizes the output signals of the pair of negative-resistance circuits on condition that fundamental waves of the output signals have an opposite phase and second order harmonic waves have an identical phase.

2. The oscillator circuit as claimed in claim 1 further comprising a bonding wire coupling the pair of pads.

3. The oscillator circuit as claimed in claim 1, wherein the pair of pads are respectively provided on the pair of transmission lines.

4. The oscillator circuit as claimed in claim 1, wherein the pair of pads are respectively provided separately from the pair of transmission lines.

5. The oscillator circuit as claimed in claim 4 further comprising feeds that are respectively provided between the pair of pads and the pair of transmission lines and have a width smaller than that of the pair of pads.

6. The oscillator circuit as claimed in claim 1 further comprising a pair of varactor diodes that are respectively coupled to the pair of transmission lines.

7. The oscillator circuit as claimed in claim 1, wherein an output frequency of the synthetic circuit is 5 GHz or more.

8. The oscillator circuit as claimed in claim 1, wherein the pair of pads are arranged symmetrically to each other in a range of plus minus $1/10\,\lambda$ with respect to a wavelength "$\lambda$" of a fundamental wave.

9. An oscillator circuit comprising:
   a pair of negative-resistance circuits;
   a pair of transmission lines that are respectively coupled to the pair of negative-resistance circuits;
   a conductor coupling symmetrical positions of the pair of transmission lines; and
   a synthetic circuit to synthesize output signals of the pair of negative-resistance circuits,
   wherein the synthetic circuit synthesizes the output signals of the pair of negative-resistance circuits on condition that fundamental waves of the output signals have an opposite phase and second order harmonic waves have an identical phase.

10. The oscillator circuit as claimed in claim 9 further comprising a pair of varactor diodes that are respectively coupled to the pair of transmission lines.

11. The oscillator circuit as claimed in claim 9, wherein an output frequency of the synthetic circuit is 5 GHz or more.

* * * * *